(12) United States Patent
Shur et al.

(10) Patent No.: US 11,329,196 B2
(45) Date of Patent: May 10, 2022

(54) OPTOELECTRONIC DEVICE MOUNTING STRUCTURE WITH EMBEDDED HEATSINK ELEMENT

(71) Applicant: Sensor Electronic Technology, Inc., Columbia, SC (US)

(72) Inventors: Michael Shur, Vienna, VA (US); Grigory Simin, Columbia, SC (US); Alexander Dobrinsky, Silver Spring, MD (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 15/926,166

(22) Filed: Mar. 20, 2018

(65) Prior Publication Data

US 2018/0219137 A1  Aug. 2, 2018

Related U.S. Application Data

(63) Continuation of application No. 15/291,169, filed on Oct. 12, 2016, now abandoned.

(60) Provisional application No. 62/240,585, filed on Oct. 13, 2015.

(51) Int. Cl.
*H01L 33/48* (2010.01)
*H01L 27/12* (2006.01)
*H01L 33/64* (2010.01)
*H01L 33/62* (2010.01)
*H01L 27/15* (2006.01)

(52) U.S. Cl.
CPC ........ *H01L 33/486* (2013.01); *H01L 27/1214* (2013.01); *H01L 27/156* (2013.01); *H01L 33/62* (2013.01); *H01L 33/642* (2013.01); *H01L 2224/16225* (2013.01); *H01L 2933/0016* (2013.01); *H01L 2933/0066* (2013.01); *H01L 2933/0075* (2013.01)

(58) Field of Classification Search
CPC . H01L 2224/73265; H01L 2224/48227; H01L 33/62; H01L 33/486; H01L 2924/12041; H01L 27/1214; H01L 27/156; H01L 33/642; H01L 2933/0016; H01L 2933/0066; H01L 2933/0075
USPC ................ 257/79, 88, 98, 99, 100, E33.056, 257/E33.075
See application file for complete search history.

(56) References Cited

U.S. PATENT DOCUMENTS

| 2005/0072457 | A1  | 4/2005 | Glenn |
| 2005/0121686 | A1* | 6/2005 | Keller ................... H01L 25/167 257/99 |
| 2005/0189557 | A1  | 9/2005 | Mazzochette et al. |

(Continued)

OTHER PUBLICATIONS

Chen, D., U.S. Appl. No. 15/291,169, Final Office Action1, dated Oct. 20, 2017, 21 pages.

(Continued)

*Primary Examiner* — David Chen
(74) *Attorney, Agent, or Firm* — LaBatt, LLC

(57) ABSTRACT

A mounting structure for mounting a set of optoelectronic devices is provided. A mounting structure for a set of optoelectronic devices can include: a body formed of an insulating material; and a heatsink element embedded within the body. A heatsink can be located adjacent to the mounting structure. The set of optoelectronic devices can be mounted on a side of the mounting structure opposite of the heatsink.

20 Claims, 13 Drawing Sheets

(56) References Cited

U.S. PATENT DOCUMENTS

| | | | |
|---|---|---|---|
| 2006/0006404 A1* | 1/2006 | Ibbetson | H01L 33/486 257/99 |
| 2006/0068515 A1* | 3/2006 | Li | H01L 24/17 438/22 |
| 2006/0192222 A1 | 8/2006 | Chen et al. | |
| 2006/0249745 A1 | 11/2006 | Chae et al. | |
| 2006/0261351 A1* | 11/2006 | Nakazato | H01L 33/645 257/79 |
| 2006/0278885 A1 | 12/2006 | Tain et al. | |
| 2009/0273002 A1* | 11/2009 | Chiou | H01L 33/642 257/99 |
| 2012/0062115 A1* | 3/2012 | Song | H01L 25/167 315/51 |
| 2012/0225509 A1* | 9/2012 | Wang | H01L 33/62 438/27 |
| 2013/0087367 A1* | 4/2013 | Imai | H01L 33/647 174/252 |
| 2013/0187182 A1* | 7/2013 | Muramatsu | H01L 33/60 257/98 |
| 2013/0187571 A1* | 7/2013 | Yeh | H01L 25/167 315/309 |
| 2014/0197436 A1 | 7/2014 | Kim | |
| 2014/0264410 A1* | 9/2014 | Lin | H01L 25/167 257/98 |
| 2014/0367718 A1* | 12/2014 | Park | H01L 33/486 257/98 |
| 2015/0070909 A1 | 3/2015 | Jung et al. | |
| 2017/0095582 A1 | 4/2017 | Shur et al. | |
| 2017/0104135 A1 | 4/2017 | Shur et al. | |

OTHER PUBLICATIONS

Chen, D., U.S. Appl. No. 15/291,169, Office Action1, dated Mar. 31, 2017, 20 pages.

Shatalov, M., et al., "Thermal analysis of flip-chip packaged 280 nm nitride-based deep ultraviolet light-emitting diodes," Applied Physics Letters, 2005, 3 pages, vol. 86.

* cited by examiner

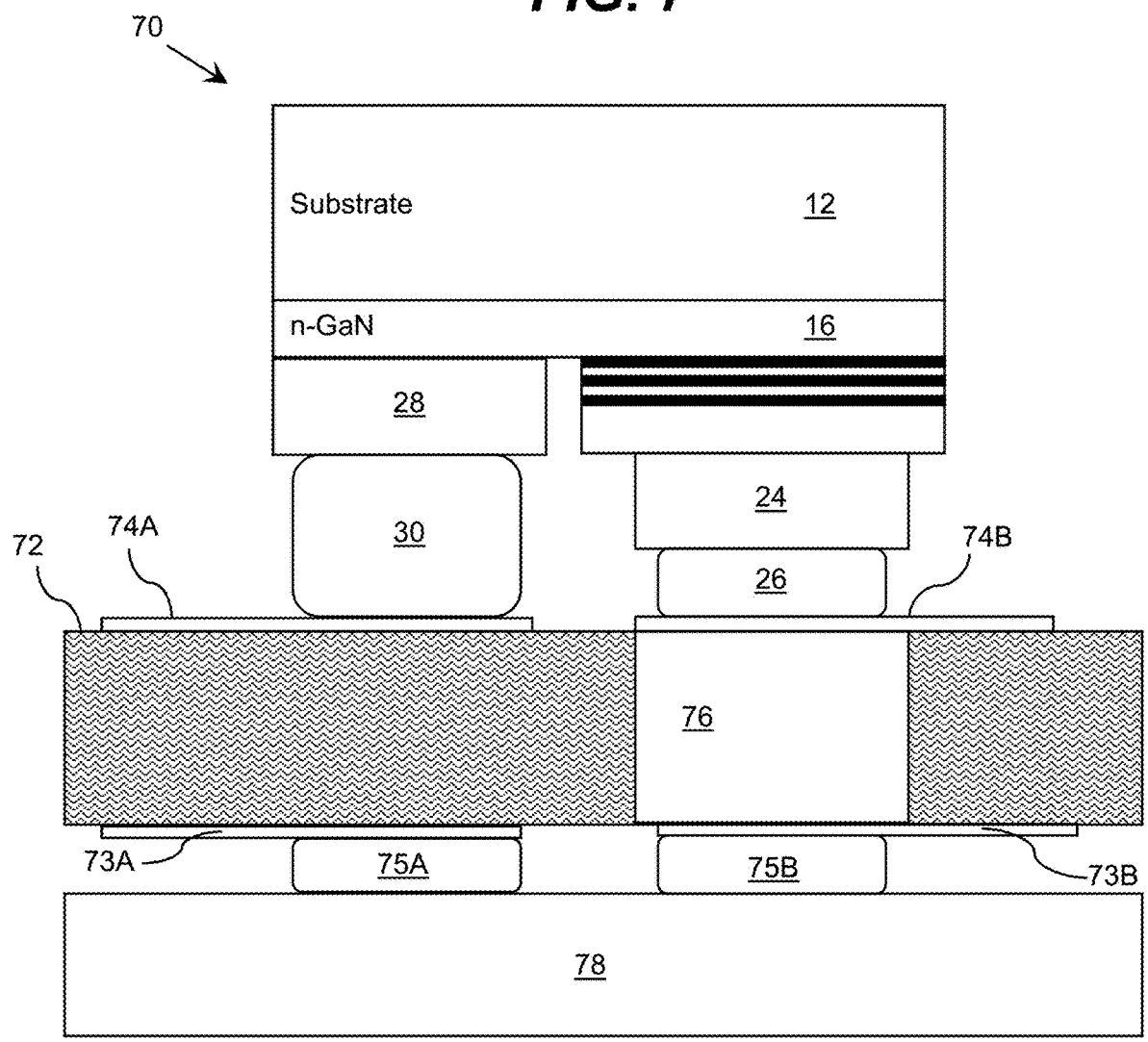

# US 11,329,196 B2

OPTOELECTRONIC DEVICE MOUNTING STRUCTURE WITH EMBEDDED HEATSINK ELEMENT

REFERENCE TO RELATED APPLICATIONS

The current application is a continuation of U.S. patent application Ser. No. 15/291,169, filed on 12 Oct. 2016, which claims the benefit of U.S. Provisional Application No. 62/240,585, filed on 13 Oct. 2015, both of which are hereby incorporated by reference.

TECHNICAL FIELD

The disclosure relates generally to light emitting diodes, and more particularly, to a mounting structure for a set of light emitting diodes.

BACKGROUND ART

A great deal of interest has been focused on light emitting diodes and lasers, in particular those that emit light in the blue and deep ultraviolet (UV) wavelengths. These devices may be capable of being incorporated into various applications, including solid-state lighting, biochemical detection, high-density data storage, and the like.

To increase the light output, the light-emitting diodes (LED) are often mounted using flip-chip technology onto a ceramic substrate, a printed-circuit board (PCB), or a similar type of mount. Although this technology helps light extraction and has high yield and production efficiency, it does not provide a path for heat removal that is as efficient as metal or metal-ceramic packages.

SUMMARY OF THE INVENTION

Aspects of the invention provide a mounting structure for mounting a set of optoelectronic devices. In an embodiment, a mounting structure for a set of optoelectronic devices includes: a body formed of an insulating material; and a heatsink element embedded within the body. A heatsink is located adjacent to the mounting structure. The set of optoelectronic devices are mounted on a side of the mounting structure opposite of the heatsink.

A first aspect of the invention provides a device comprising: a set of optoelectronic devices; a mounting structure for the set of optoelectronic devices, wherein the mounting structure includes: a body formed of an insulating material; and a heatsink element embedded within the body; and a heatsink located adjacent to the mounting structure.

A second aspect of the invention provides a device comprising: a first optoelectronic device mounted on a first mounting structure; a second optoelectronic device mounted on a second mounting structure, wherein each mounting structure includes: a body formed of an insulating material; and a heatsink element embedded within the body; and a heatsink, wherein the first mounting structure and the second mounting structure are located on opposite sides of the heatsink.

A third aspect of the invention provides a method comprising: providing a heatsink including an embedded heatsink element protruding from a lateral surface of the heatsink; depositing an insulating material over the heatsink to form a mounting structure; and mounting an optoelectronic device onto the mounting structure.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIG. 2A shows a schematic structure of an optoelectronic device according to the prior art, while

FIG. 7 shows a schematic structure of an optoelectronic device according to an embodiment.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a mounting structure for mounting a set of optoelectronic devices. In an embodiment, a mounting structure for a set of optoelectronic devices includes: a body formed of an insulating material; and a heatsink element embedded within the body. A heatsink is located adjacent to the mounting structure. The set of optoelectronic devices are mounted on a side of the mounting structure opposite of the heatsink.

As used herein, unless otherwise noted, the term "set" means one or more (i.e., at least one) and the phrase "any solution" means any now known or later developed solution. It is understood that, unless otherwise specified, each value is approximate and each range of values included herein is inclusive of the end values defining the range. As used herein, unless otherwise noted, the term "approximately" is inclusive of values within +/− ten percent of the stated value, while the term "substantially" is inclusive of values within +/− five percent of the stated value. Unless otherwise stated, two values are "similar" when the smaller value is within +/− twenty-five percent of the larger value. A value, y, is on the order of a stated value, x, when the value y satisfies the formula $0.1x \leq y \leq 10x$.

As also used herein, a layer is a transparent layer when the layer allows at least ten percent of radiation having a target wavelength, which is radiated at a normal incidence to an interface of the layer, to pass there through. Furthermore, as used herein, a layer is a reflective layer when the layer reflects at least ten percent of radiation having a target wavelength, which is radiated at a normal incidence to an interface of the layer. In an embodiment, the target wavelength of the radiation corresponds to a wavelength of radiation emitted or sensed (e.g., peak wavelength +/− five nanometers) by an active region of an optoelectronic device during operation of the device. For a given layer, the wavelength can be measured in a material of consideration and can depend on a refractive index of the material. Additionally, as used herein, a contact is considered "ohmic" when the contact exhibits close to linear current-voltage behavior over a relevant range of currents/voltages to enable use of a linear dependence to approximate the current-voltage relation through the contact region within the relevant range of currents/voltages to a desired accuracy (e.g., +/− one percent).

Figure 1:
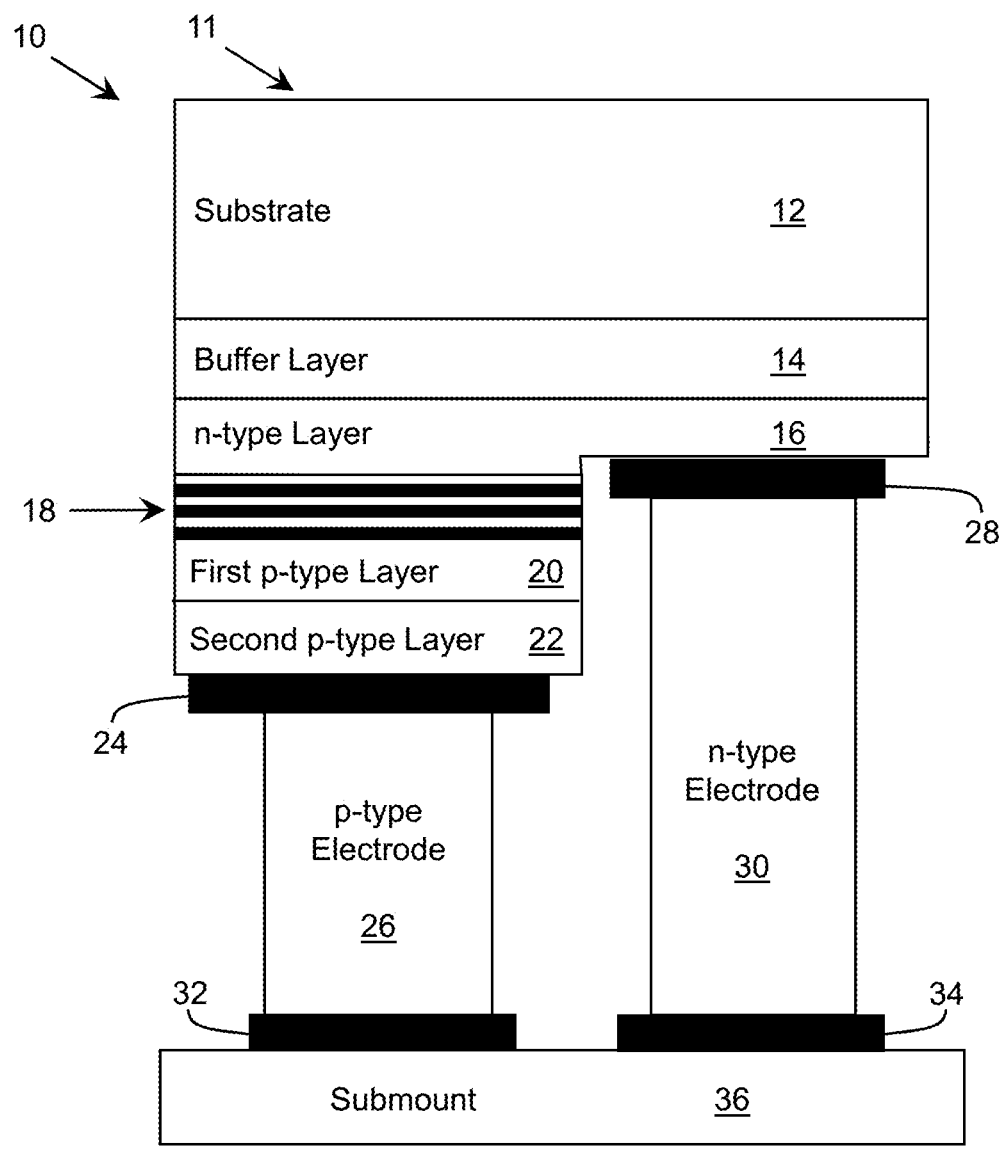
FIG. 1 shows a schematic structure of an optoelectronic device according to the prior art.

Turning to the drawings, FIG. 1 shows a schematic structure of an optoelectronic device 10 according to prior art. In a more particular embodiment, the optoelectronic device 10 is configured to operate as an emitting device, such as a light emitting diode (LED), UV LEDs, a laser diode (LD), photodiodes, high electron mobility transistors (HEMTs), and/or the like. More generally, the optoelectronic device 10 can be any type of diode that can be flip-chip mounted under normal operating conditions. In any case, during operation of the optoelectronic device 10, application of a bias comparable to the band gap results in the emission of electromagnetic radiation from an active region 18 of the optoelectronic device 10. The electromagnetic radiation emitted (or sensed) by the optoelectronic device 10 can have a peak wavelength within any range of wavelengths, including visible light, ultraviolet radiation, deep ultraviolet radiation, infrared light, and/or the like. In an embodiment, the device 10 is configured to emit (or sense) radiation having a dominant wavelength within the ultraviolet range of wavelengths. In a more specific embodiment, the dominant wavelength is within a range of wavelengths between approximately 210 and approximately 360 nanometers.

The optoelectronic device 10 includes a heterostructure 11 comprising a substrate 12, a buffer layer 14 adjacent to the substrate 12, an n-type layer 16 (e.g., a cladding layer, electron supply layer, contact layer, and/or the like) adjacent to the buffer layer 14, and an active region 18 having an n-type side adjacent to the n-type layer 16. Furthermore, the heterostructure 11 of the optoelectronic device 10 includes a first p-type layer 20 (e.g., an electron blocking layer, a cladding layer, hole supply layer, and/or the like) adjacent to a p-type side of the active region 18 and a second p-type layer 22 (e.g., a cladding layer, hole supply layer, contact layer, and/or the like) adjacent to the first p-type layer 20.

In a more particular illustrative embodiment, the optoelectronic device 10 is a group III-V materials based device, in which some or all of the various layers are formed of elements selected from the group III-V materials system. In a still more particular illustrative embodiment, the various layers of the optoelectronic device 10 are formed of group III nitride based materials. Group III nitride materials comprise one or more group III elements (e.g., boron (B), aluminum (Al), gallium (Ga), and indium (In)) and nitrogen (N), such that $B_WAl_XGa_YIn_ZN$, where $0 \leq W, X, Y, Z \leq 1$, and $W+X+Y+Z=1$. Illustrative group III nitride materials include binary, ternary and quaternary alloys such as, AlN, GaN, InN, BN, AlGaN, AlInN, AlBN, AlGaInN, AlGaBN, AlInBN, and AlGaInBN with any molar fraction of group III elements.

An illustrative embodiment of a group III nitride based optoelectronic device 10 includes an active region 18 (e.g., a series of alternating quantum wells and barriers) composed of $In_yAl_xGa_{1-x-y}N$, $Ga_zIn_yAl_xB_{1-x-y-z}N$, an $Al_xGa_{1-x}N$ semiconductor alloy, or the like. Similarly, the n-type layer 16, the first p-type layer 20, and the second p-type layer 22 can be composed of an $In_yAl_xGa_{1-x-y}N$ alloy, a $Ga_zIn_yAl_xB_{1-x-y-z}N$ alloy, or the like. The molar fractions given by x, y, and z can vary between the various layers 16, 18, 20, and 22. When the optoelectronic device 10 is configured to be operated in a flip chip configuration, such as shown in FIG. 1, the substrate 12 and buffer layer 14 should be transparent to the target electromagnetic radiation. To this extent, an embodiment of the substrate 12 is formed of sapphire, and the buffer layer 14 can be composed of AlN, an AlGaN/AlN superlattice, and/or the like. However, it is understood that the substrate 12 can be formed of any suitable material including, for example, silicon carbide (SiC), silicon (Si), bulk GaN, bulk AlN, bulk or a film of AlGaN, bulk or a film of BN, AlON, $LiGaO_2$, $LiAlO_2$, aluminum oxinitride ($AlO_xN_y$), $MgAl_2O_4$, GaAs, Ge, or another suitable material. Furthermore, a surface of the substrate 12 can be substantially flat or patterned using any solution.

The optoelectronic device 10 can further include a p-type contact 24, which can form an ohmic contact to the second p-type layer 22, and a p-type electrode 26 can be attached to the p-type contact 24. Similarly, the optoelectronic device 10 can include an n-type contact 28, which can form an ohmic contact to the n-type layer 16, and an n-type electrode 30 can be attached to the n-type contact 28. The p-type contact 24 and the n-type contact 28 can form ohmic contacts to the corresponding layers 22, 16, respectively.

In an embodiment, the p-type contact 24 and the n-type contact 28 each comprise several conductive and reflective metal layers, while the n-type electrode 30 and the p-type electrode 26 each comprise highly conductive metal. In an embodiment, the second p-type layer 22 and/or the p-type electrode 26 can be transparent to the electromagnetic radiation generated by the active region 18. For example, the second p-type layer 22 and/or the p-type electrode 26 can comprise a short period superlattice lattice structure, such as an at least partially transparent magnesium (Mg)-doped AlGaN/AlGaN short period superlattice structure (SPSL). Furthermore, the p-type electrode 26 and/or the n-type electrode 30 can be reflective of the electromagnetic radiation generated by the active region 18. In another embodiment, the n-type layer 16 and/or the n-type electrode 30 can be formed of a short period superlattice, such as an AlGaN SPSL, which is transparent to the electromagnetic radiation generated by the active region 18.

As further shown with respect to the optoelectronic device 10, the device 10 can be mounted to a submount 36 via the electrodes 26, 30 in a flip chip configuration. In this case, the substrate 12 is located on the top of the optoelectronic device 10. To this extent, the p-type electrode 26 and the n-type electrode 30 can both be attached to a submount 36 via contact pads 32, 34, respectively. The submount 36 can be formed of aluminum nitride (AlN), silicon carbide (SiC), and/or the like.

Figure 2A:
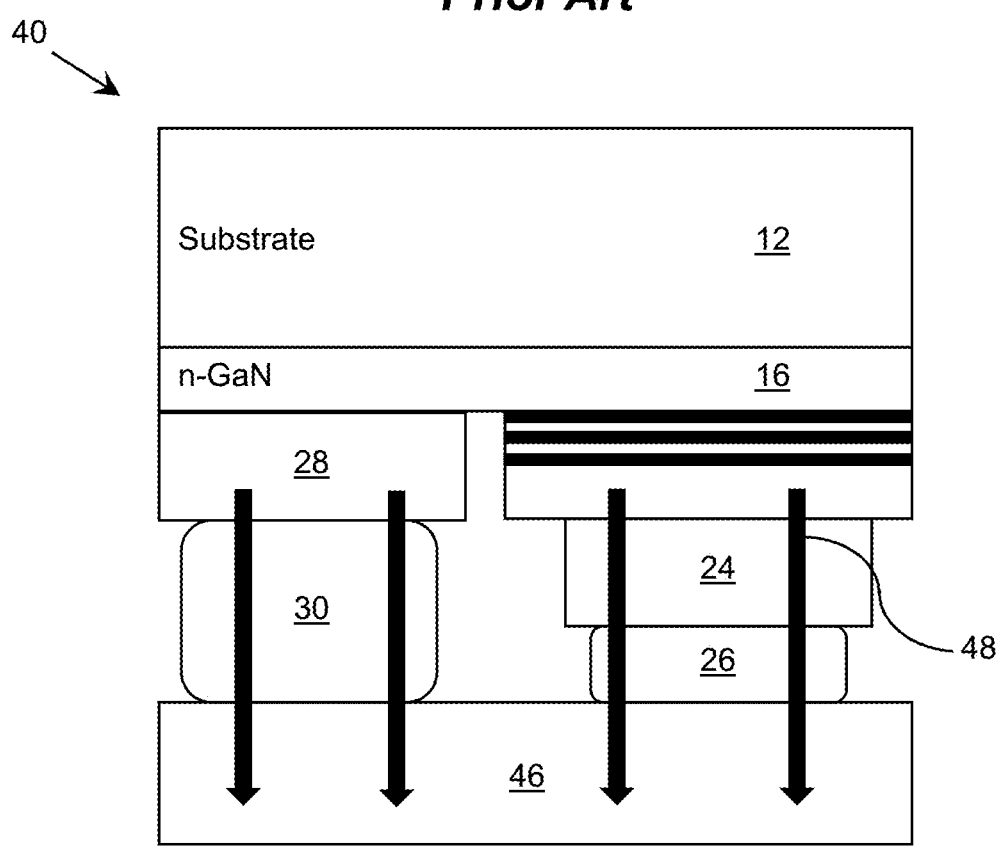
Figure 2B:
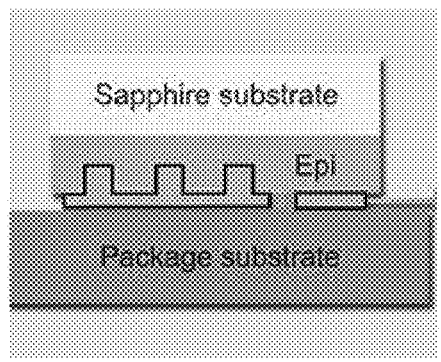
FIGS. 2B-2E show other examples of flip-chip technologies and mounting structures according to the prior art.
Figure 2C:
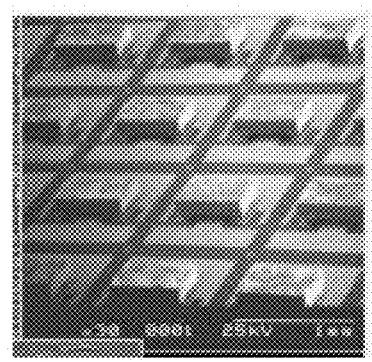
Figure 2D:
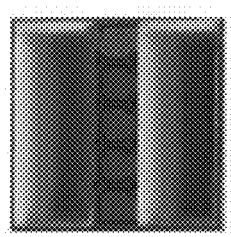
Figure 2E:
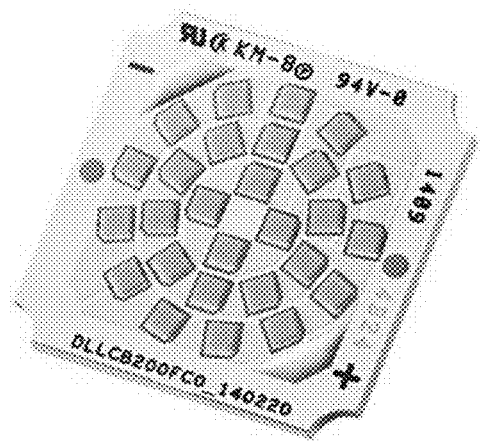

As mentioned above, to increase the light output, the optoelectronic device 10 can also be mounted on a ceramic substrate mount, a printed circuit board (PCB), and/or the like. For example, in FIG. 2A, a schematic structure of a prior art optoelectronic device 40 is shown. The optoelectronic device 40 is similar to the device 10 shown in FIG. 1, but the device 40 is mounted on a PCB 46. The optoelectronic device 40 can comprise a Wafer Integrated Chip on PCB (WICOP) structure by Seoul Semiconductor. Heat 48 is generated and transferred from the contacts 24, 28 to the PCB 46. The main disadvantage of this device 40 is that the contacts 24, 28 have to be isolated from each other by a dielectric layer, which has typically has low thermally conductive values. This dielectric layer results in a barrier for the heat extraction. FIGS. 2B-2E show other examples of flip-chip technologies and mounting structures. FIG. 2B shows a flip chip LED structure by Genesis Photonics. The LED contacts are terminated with metal mounting bumps mated to the metallized pattern formed on the package substrate. FIG. 2C shows an LED array by Semicon West where each LED is flip-chip mounted on a patterned holder. FIG. 2D shows a LED chip by LUXEON FlipChip Royal Blue. The chip contains two metal bumps terminated with soldering material which provides the ability to flip chip mount the LED on a package or sub-holder. FIG. 2E shows an example of a Samsung flip-chip mounted multi-LED structure. The LEDs are mounted on a ceramic substrate. A common issue with all the presented prior art examples is that the substrate or package material present a significant thermal resistance for heat removal from the mounted LEDs.

Figure 3:
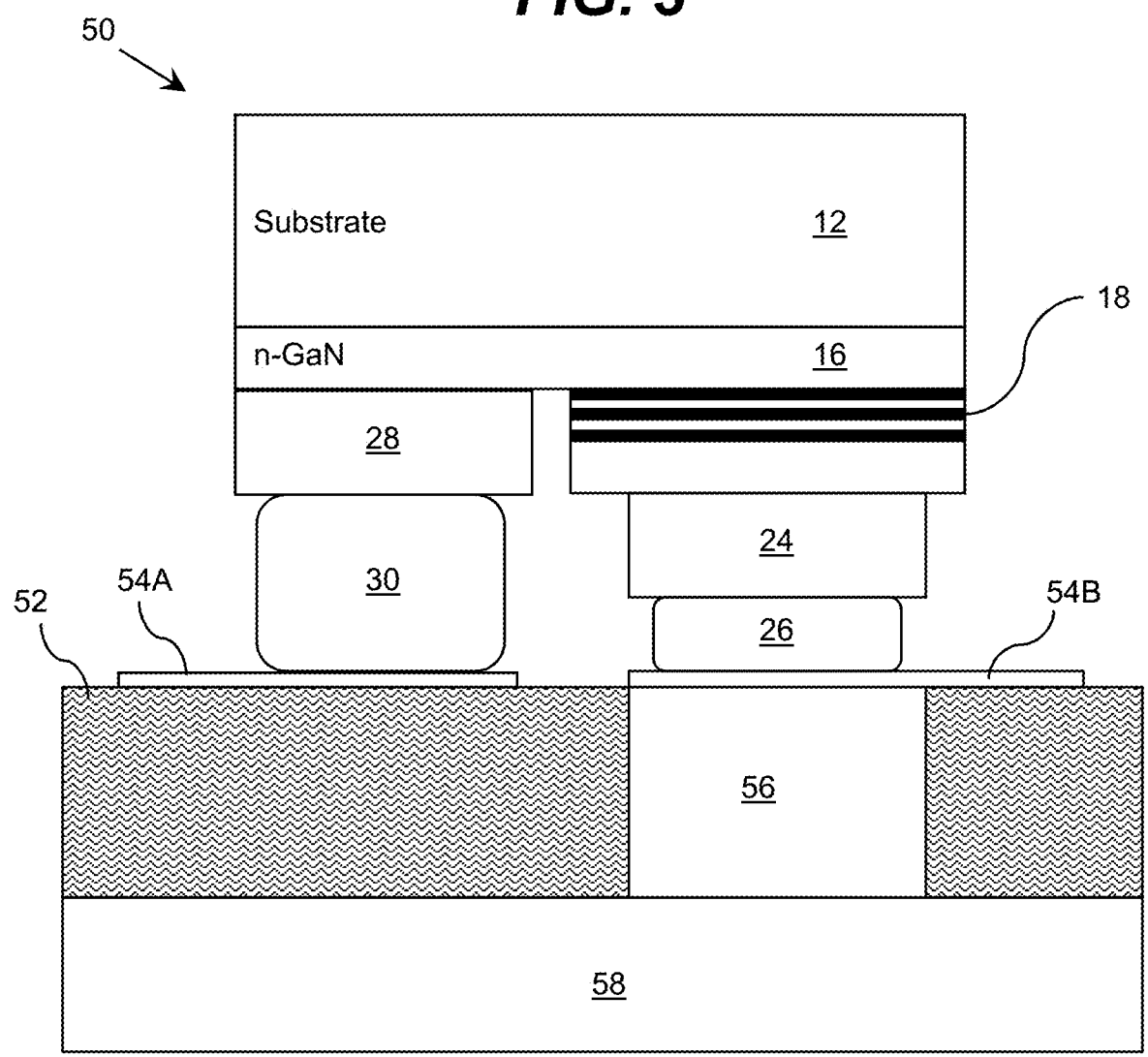
FIG. 3 shows a schematic structure of an optoelectronic device according to an embodiment.

Turning now to FIG. 3, a schematic structure of an illustrative optoelectronic device 50 according to an embodiment is shown. The optoelectronic device 50 is configured similar to the optoelectronic devices 10, 40 shown in FIGS. 1 and 2A. However, the optoelectronic device 50 includes a mounting structure 52 that is formed of an insulating material with high thermal conductivity, such as silicon carbide (SiC), diamond film, aluminum nitride (AlN) ceramic, and/or the like. The mounting structure 52 is a thin layer, e.g., approximately tens of microns to a few millimeters.

The p-type electrode 26 and the n-type electrode 30 are connected to the mounting structure 52 by a set of metal contacts 54A, 54B. The metal contacts 54A, 54B can be formed of any metallic material that is conductive with chemical stability and low oxidation, such as copper, gold, nickel and/or the like. The metal contacts 54A, 54B can form a set of biasing lines that can connect the electrodes 26, 30 of different optoelectronic devices 50. An embedded heatsink element 56 is located within the mounting structure 52 and connects the p-type electrode 26 to a heatsink 58 for heat removal. The p-type electrode 26 is connected to the p-contact 24 and an active region 18 of the optoelectronic device 50. This arrangement provides the shortest path and the smallest thermal resistance from the device active region 18 to the heatsink 58. The n-type electrode 30 is not connected to the embedded heatsink element 56 in order to avoid a short-circuit between the n-type electrode 30 and the p-type electrode 26. However, it is understood that this is only illustrative and the n-type electrode 30 can be connected to the embedded heatsink element 56 when the n-type electrode 30 provides a more direct path to the active region 18.

The heatsink 58 has a thermal resistance to the ambient that is comparable to the total thermal resistance of the device and device junctions. The surface of the heatsink 58 can include a plurality of protrusions (not shown) which increases the surface area between the heatsink 58 and the mounting structure 52 in order to further facilitate the heat removal. In an embodiment, the embedded heatsink element 56 can be formed by making via-holes in the mounting structure 52 and filling the via-hole with a metal material, such as copper, gold, a material with high thermal conductivity, such as AlN, and/or the like. In another embodiment, the embedded heatsink element 56 can be formed by fabricating a heatsink 58 with the embedded heatsink element 56 and depositing an insulating material to form the mounting structure 52. In another embodiment, the embedded heatsink element 56 can be soldered to the heatsink 58 prior to depositing the insulating material for the mounting structure 52.

In an embodiment, the material of the electrodes 26, 30 and the embedded heatsink element 56 can include a magnetic component to facilitate automatic alignment of the optoelectronic device 50 with the set of metal contacts 54A, 54B. The magnetic component can be formed of a material containing iron, or a similarly ferromagnetic metallic element, such as nickel, cobalt, neodymium, alloys of nickel, cobalt, or neodymium, and/or the like. In order to improve the magnetic connection, it is understood that the surface of the set of metal contacts 54A, 54B can be polished to provide an adequate contact area. In another embodiment, the magnetic component in the electrodes 26, 30 and the embedded heatsink element 56 can be for placement guidance only and soldering can be used to connect the electrodes 26, 30 to the set of metal contacts 54A, 54B. For example, a soldering material can be applied to the surface of the set of metal contacts 54A, 54B and to the surface of the electrodes 26, 30. The magnetic force between the electrodes 26, 30 and the embedded heatsink element 56 can be used to guide the electrodes 26, 30 and the set of metal contacts 54A, 54B together. In another embodiment, the electrodes 26, 30 and the set of metal contacts 54A, 54B can include a set of electric connectors, such as universal serial bus (USB) connectors, and/or the like, to provide accurate contact.

By having a mounting structure 52, the p-type electrode 26 and the n-type electrode 30 are electrically isolated from one another and from the heatsink 58, which can likely conduct electricity since it can comprise a metallic material, without having a dielectric layer that acts as a barrier to the heat extraction.

It is understood that the arrangement of the electrodes 26, 30 in the mesa region of the optoelectronic device 50 is for exemplary purposes only and that the electrodes 26, 30 can be arranged in any orientation. Also, the mesa structure of the optoelectronic device 50 can include any shape.

Figure 4:
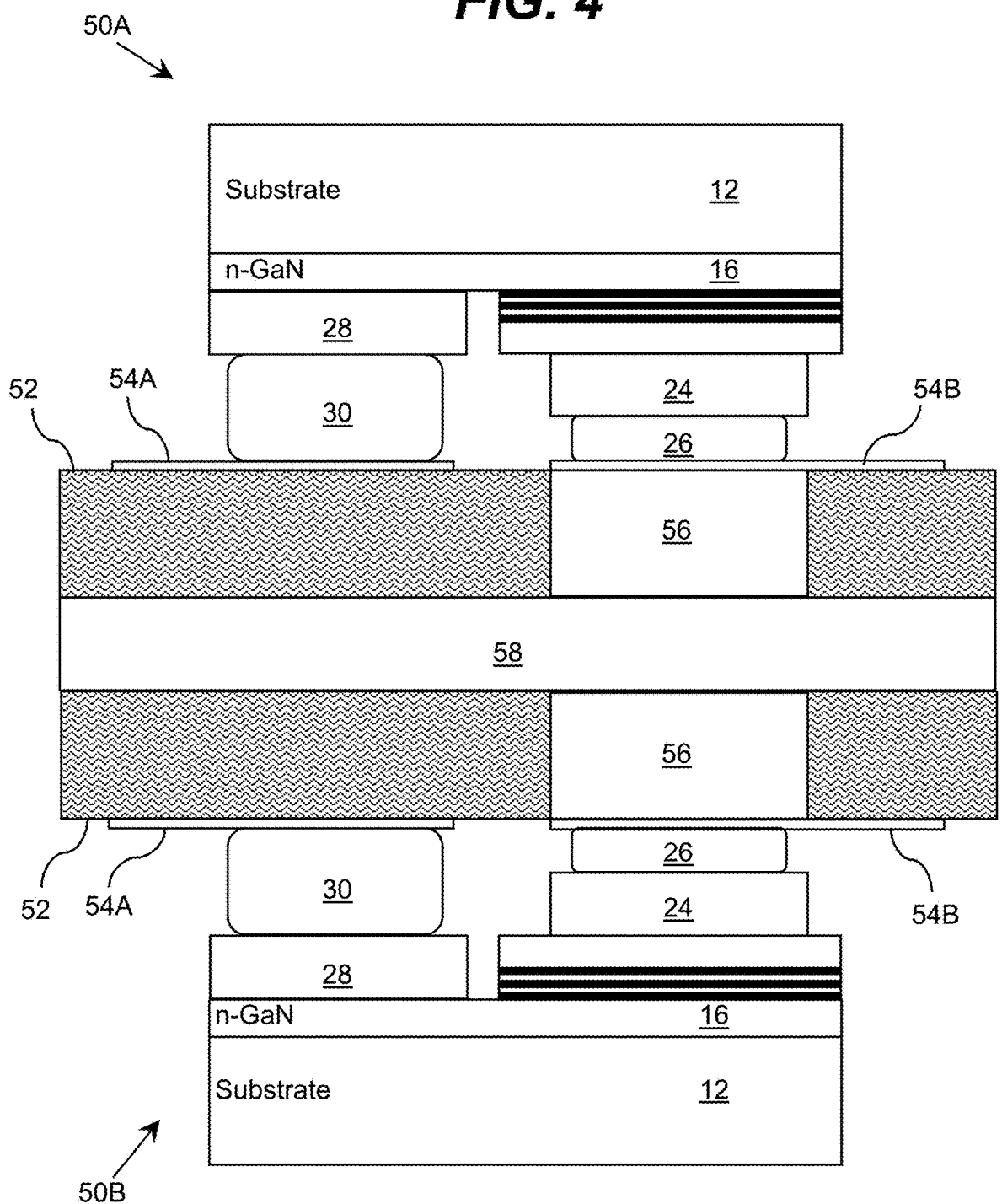
FIG. 4 shows a schematic structure of a set of optoelectronic devices according to an embodiment.

In an embodiment, multiple optoelectronic devices can be connected to a single heatsink. For example, as shown in FIG. 4, a first optoelectronic device 50A and a second optoelectronic device 50B are mounted on opposing sides of a heatsink 58. Each optoelectronic device 50A, 50B can include all the features of the optoelectronic device 50 shown in FIG. 3.

Figure 5:
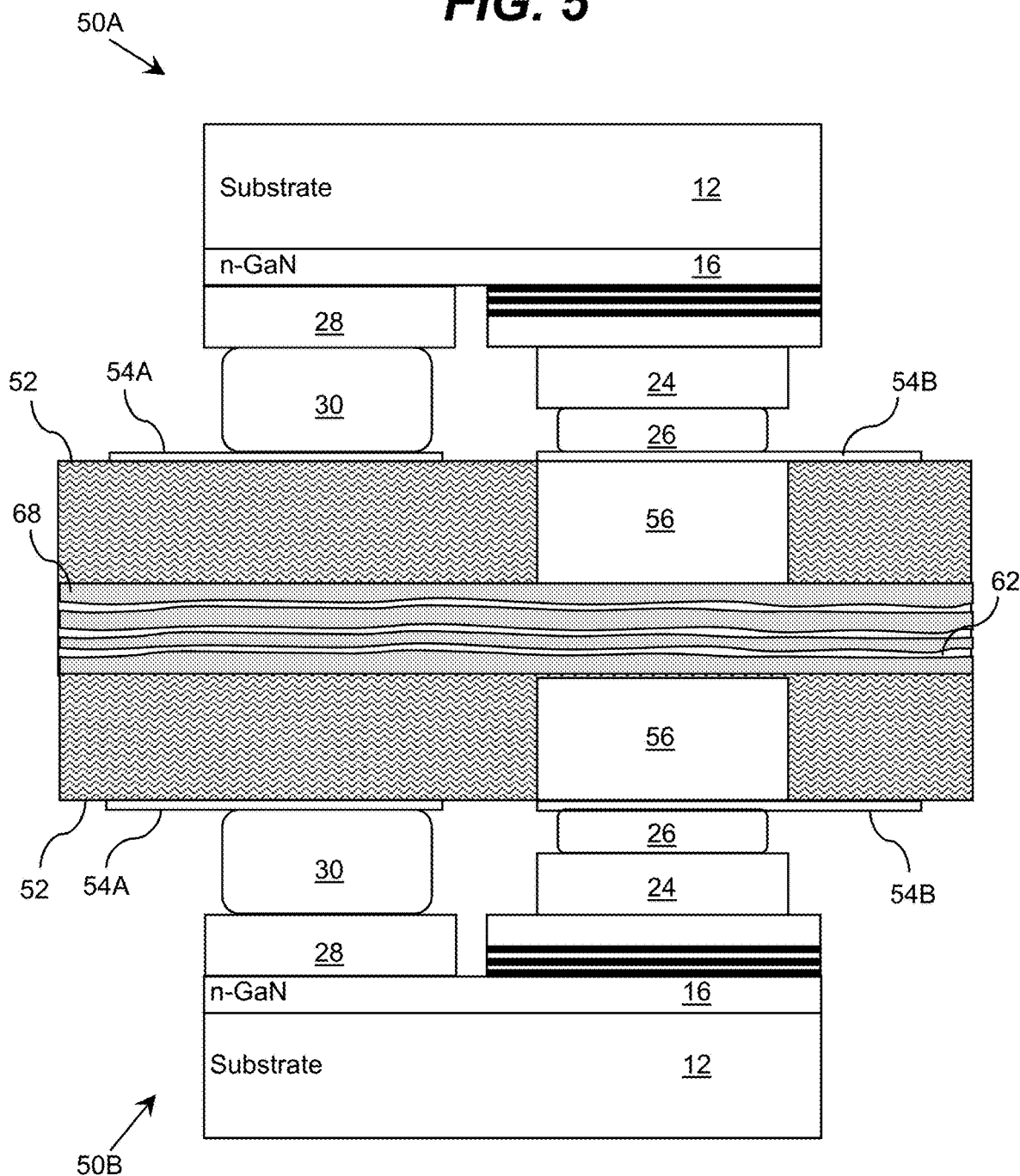
FIG. 5 shows a schematic structure of a set of optoelectronic devices according to an embodiment.

In another embodiment, as seen in FIG. 5, a heatsink 68 that is connected to the first and second optoelectronic devices 50A, 50B can include a plurality of cooling channels 62. The cooling channels 62 can be configured to accommodate a cooling gas and/or liquid. The embedded channels 62 can be formed using any solution.

Figure 6A:
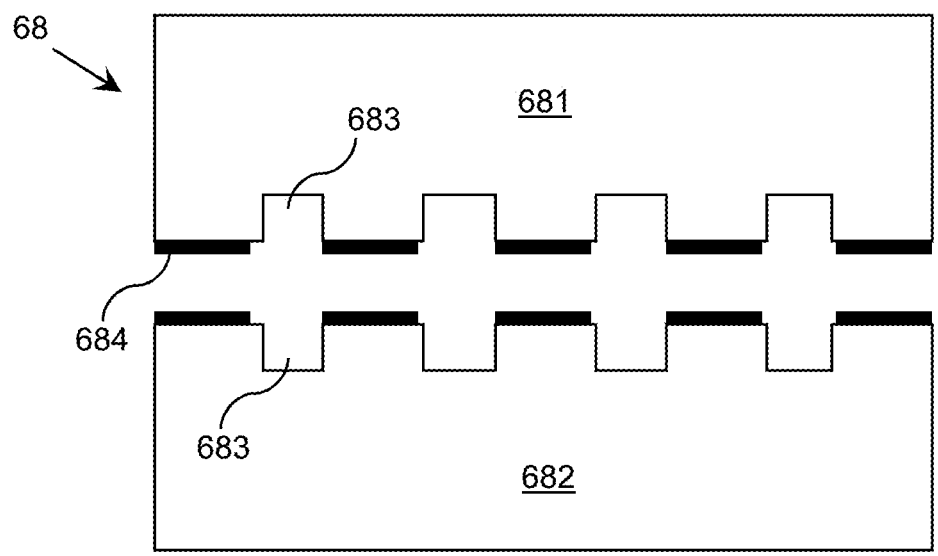
FIGS. 6A and 6B shows an illustrative heatsink including cooling channels according to an embodiment.
Figure 6B:
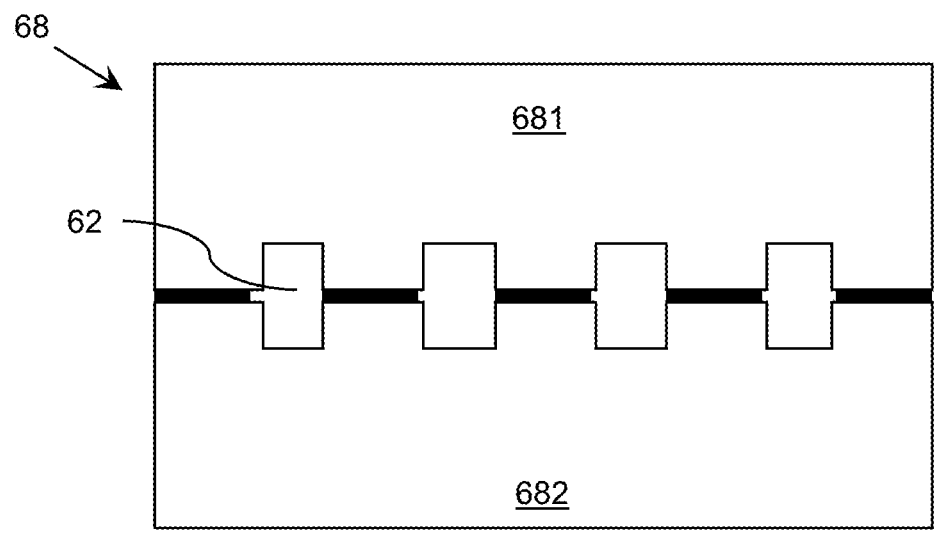

In an illustrative example shown in FIGS. 6A and 6B, the heatsink 68 can be fabricated by forming a top component 681 and a bottom component 682 with at least one of these components having a plurality of grooves 683. The top and bottom components 681, 682 also include a plurality of metallized and/or soldered regions 684 that are located between each of the plurality of grooves 683. The top and bottom components 681, 682 can be soldered together, connected together by fusion, and/or the like so that the channels 62 are formed by the plurality of grooves 683. In another embodiment, the channels 62 can be formed by drilling or etching into the heatsink 68. In another embodiment, the heatsink 68 can be formed of a porous material, such as carbon, AlN, silicon or nickel powder, and/or the like, that naturally has a plurality of channels 62. For example, the heatsink 68 can be formed of a porous metallic material that is obtained any solution, such as metallic powder sintering, and/or the like. A heatsink 68 including a plurality of cooling channels 62 can also include a means for cooling, which can include a fan configured to move air through the channels 62.

Turning now to FIG. 7, a schematic structure of an illustrative optoelectronic device 70 according to an embodiment is shown. In this embodiment, the mounting structure 72 is similar to the mounting structure 52 shown in FIG. 3. However, in FIG. 7, a set of integrated circuit (IC) control components 73A, 73B are located between the mounting structure 72 and a heatsink 78. Each of the IC control components 73A, 73B include at least the circuitry and contact pads. The set of IC control components 73A, 73B are configured to allow for the capability to switch the device 70 on or off. This on/off switch capability can be important especially in cases when multiple devices are mounted on a heatsink (e.g., devices 50A, 50B in FIGS. 4 and 5) and require optimal operation. The set of IC control components 73A, 73B can be located at different locations of the optoelectronic device 70.

The sequence of device fabrication can incorporate fabrication of the set of IC control components 73A, 73B at different stages. For example, in FIG. 7, the set of IC control components 73A, 73B are located on the mounting structure 72 on a side opposite of the set of metal contacts 74A, 74B. In an embodiment, at least one of the set of IC control components 73A, 73B can be connected to the heatsink 78 via a set of bumpers 75A, 75B. This connection between the IC control components 73A, 73B and the heatsink 78 allows for heat removal as well as ground connection for the IC control components 73A, 73B.

Figure 8:
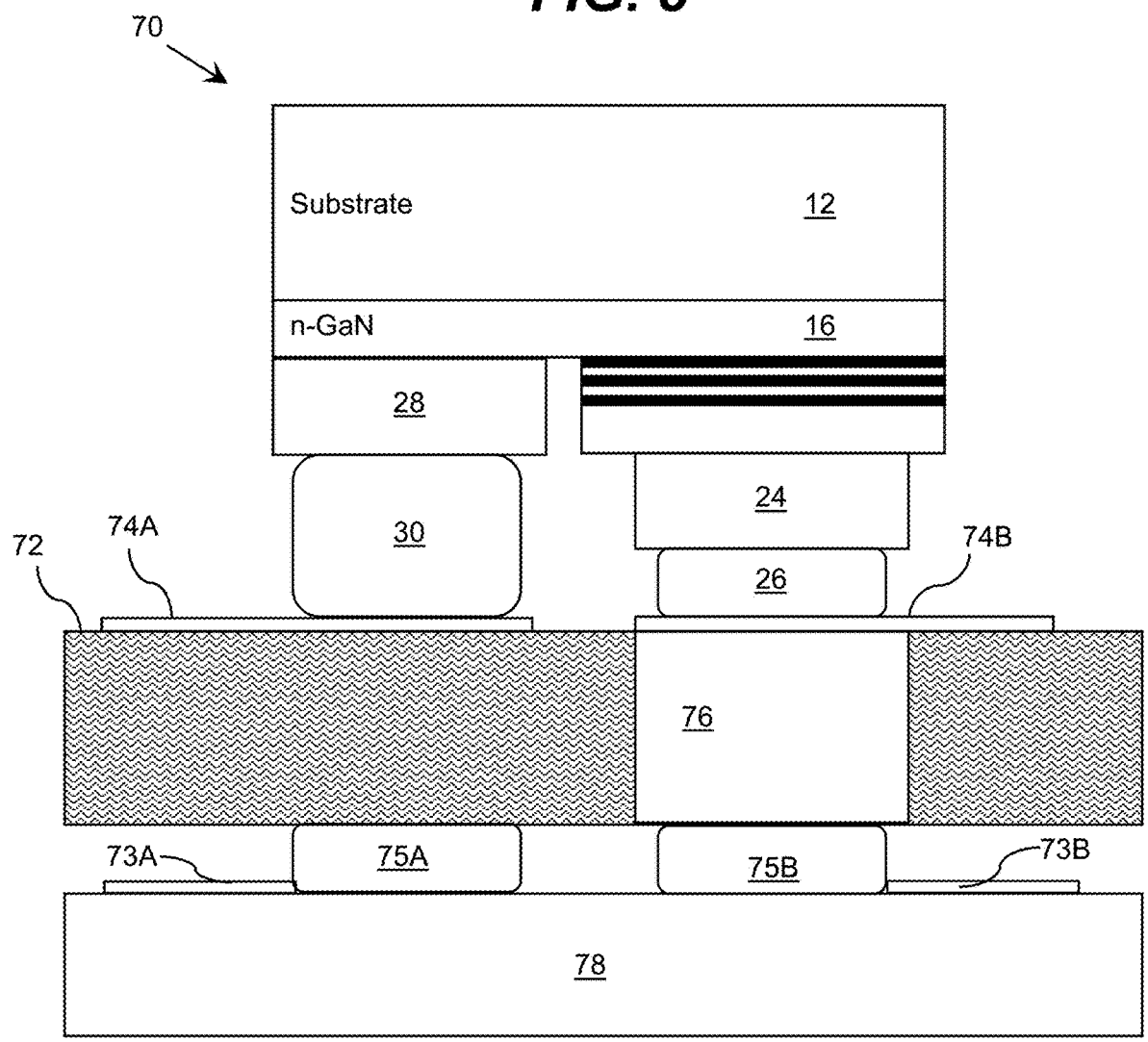
FIG. 8 shows a schematic structure of an optoelectronic device according to an embodiment.

In another embodiment shown in FIG. 8, the set of IC control components 73A, 73B are located on the heatsink 78. In this embodiment, the IC control components 73A, 73B are fabricated over an insulating substrate (not shown), such as silicon-on insulator, high-res silicon, sapphire, ceramics, and/or the like, or the IC control components 73A, 73B can each have an insulating layer, such as silicon dioxide ($SiO_2$), silicon nitride ($Si_3N_4$), and/or the like, which is deposited on the bottom side of the IC control component.

Figure 9A:
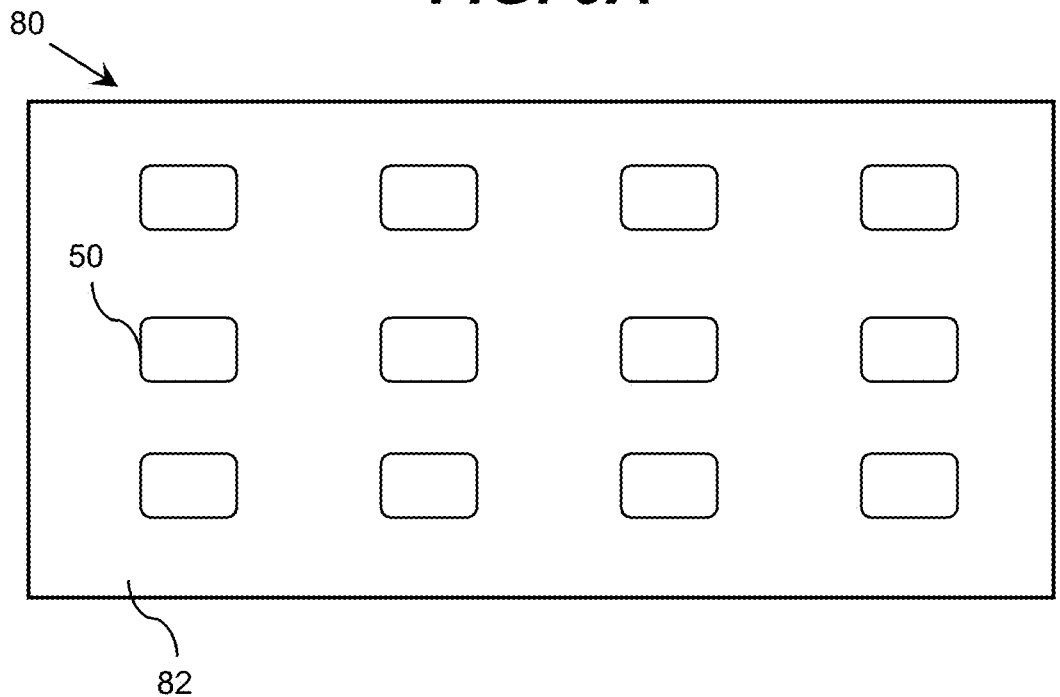
FIGS. 9A and 9B show a top view and a bottom view of an optoelectronic device array according to an embodiment.
Figure 9B:
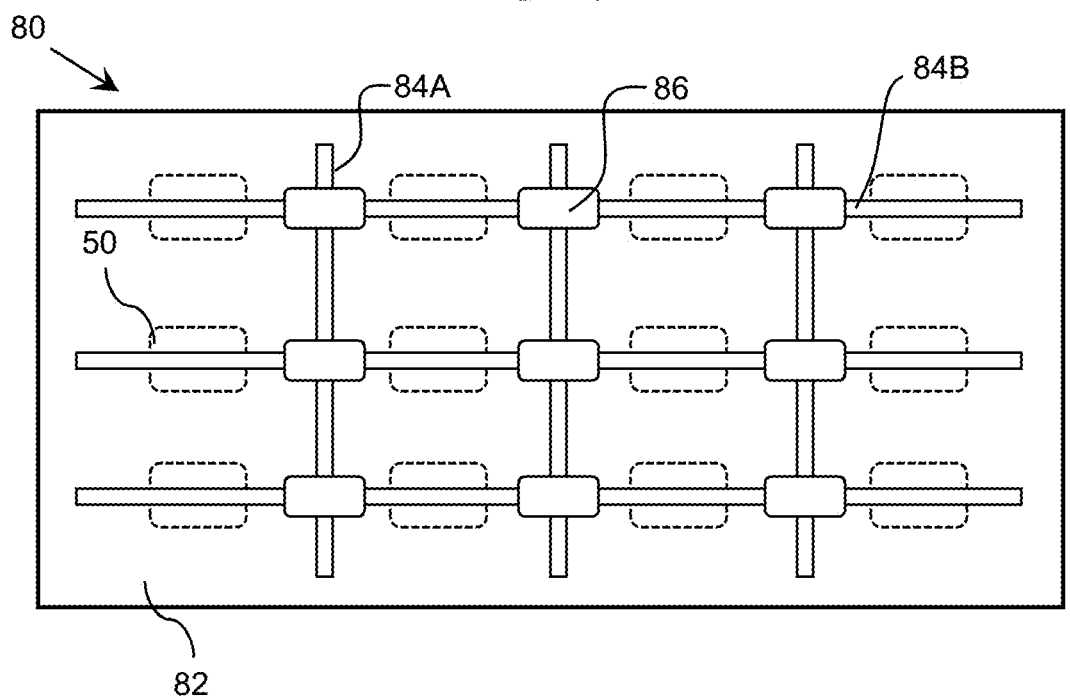

Turning now to FIGS. 9A and 9B, a top view and a bottom view of an illustrative optoelectronic device array 80 according to an embodiment is shown. The optoelectronic device array 80 can include a plurality of optoelectronic devices 50 that are similar to the device 50 shown in FIG. 3. The devices 50 are mounted on a mounting structure 82 and can be connected in a thin film transistor (TFT) active matrix arrangement, where each optoelectronic device 50 is addressable and can be individually turned on or off. The bottom view of the device array 80 is shown in FIG. 9B. The device array 80 can include a plurality of bias buses 84A, 84B that connect a plurality of IC control components 86 to the plurality of optoelectronic devices 50. The plurality of bias buses 84A, 84B form a biasing circuit that can connect or disconnect individual devices 50 to form an array 80 that emits light in various combinations. The device array 80 can also include a heatsink (e.g., heatsinks 58, 68, 78 shown in FIGS. 5-7) but is omitted from FIGS. 9A and 9B for clarity.

Figure 10:
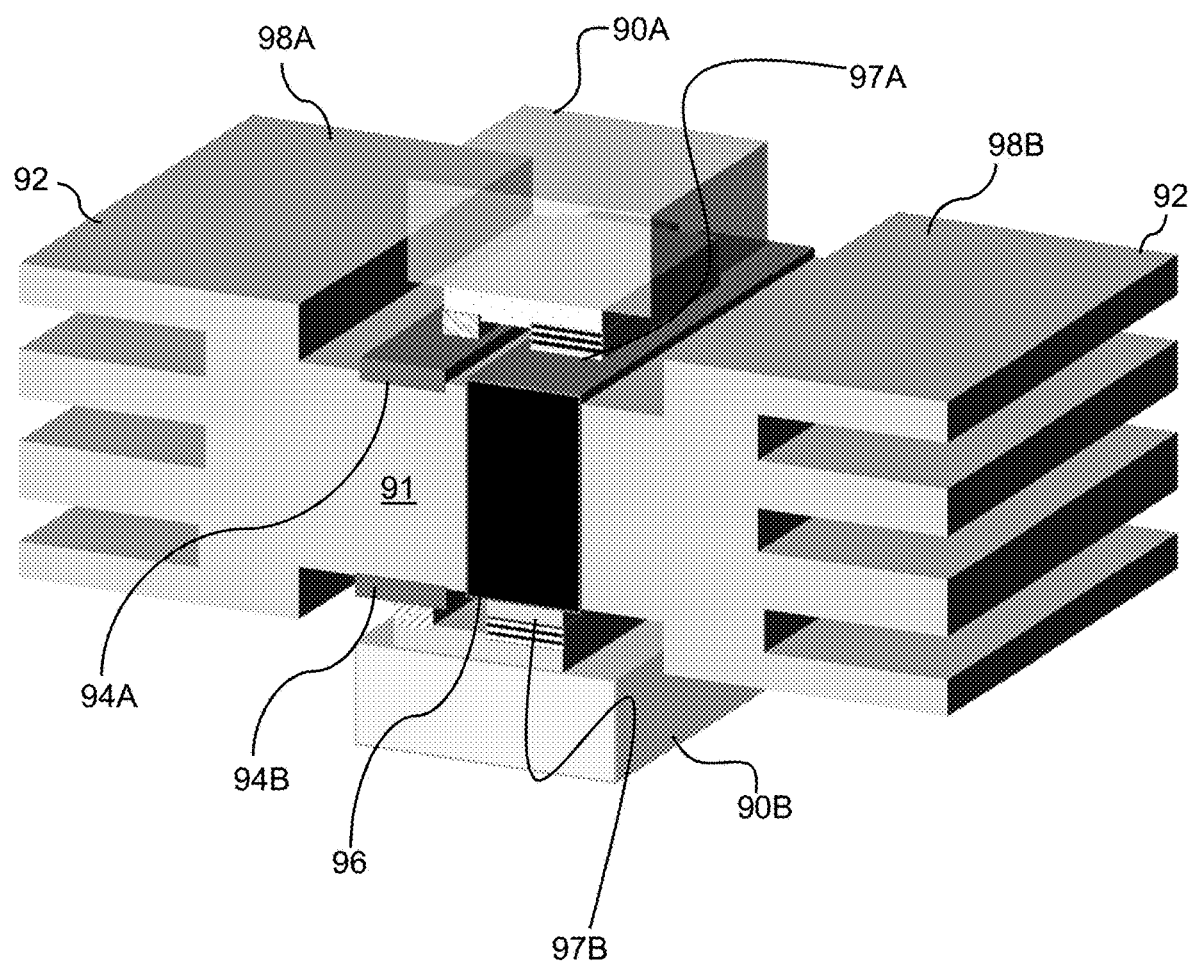
FIG. 10 shows a three-dimensional perspective view of a set of optoelectronic devices according to an embodiment.

Turning now to FIG. 10, a three-dimensional perspective view of a set of optoelectronic devices 90A, 90B according to an embodiment is shown. The set of optoelectronic devices 90A, 90B are positioned similar to the optoelectronic devices 50A, 50B shown in FIGS. 4 and 5. In this embodiment, a heatsink 91 is provided between each of the optoelectronic devices 90A, 90B and is used as both a heatsink and a mounting structure. To provide electrical isolation, the heatsink 91 is fabricated using insulating materials with high thermal conductivity, such as aluminum nitride, boron nitride, diamond and/or the like.

The optoelectronic devices 90A, 90B have common electrodes (e.g. p-type electrodes 97A, 97B) connected by an embedded heatsink element 96. The heatsink 91 extends laterally in both directions into a first heatsink domain 98A and a second heatsink domain 98B. Each heatsink domain 98A, 98B can include a plurality of fins 92 that are configured to provide improved convective heat cooling. In an embodiment, fans and/or other cooling devices can be included for further improved convective cooling. In another embodiment, only a single heatsink domain can be provided. For example, only one of the first heatsink domain 98A or the second heatsink domain 98B can be included between the optoelectronic devices 90A, 90B. In an embodiment, the heatsink domains 98A, 98B can be formed of the same or different materials. In another embodiment, the heatsink domains 98A, 98B can be different structures. For example, the first heatsink domain 98A can be formed of a porous metallic material (e.g., with cooling channels), while the second heatsink domain 98B includes the plurality of fins 92. Regardless, it is understood that the heatsink domains 98A, 98B can include any number of fins 92.

The devices 90A, 90B can be positioned arbitrarily over the heatsink 91, depending on the arrangement of the electrodes of the devices 90A, 90B. For example, in FIG. 10, the n-type electrode 94A, 94B of each device 90A, 90B are positioned laterally along the heatsink 91. Between the p-type electrodes 97A, 97B of each device 90A, 90B, the embedded heatsink element 96, which is formed of a thermally conductive filler material, can be deposited to improve heat extraction from each device 90A, 90B. The thermally conductive filler material for the embedded heatsink element 96 can be any material that is electrically insulating, such as amorphous AlN ceramics, SiC, diamond powder, diamond base grease, and/or the like. In an embodiment, the embedded heatsink element 96 has a thermal conductivity of at least ten percent of the thermal conductivity of the heatsink 91.

Figure 11:
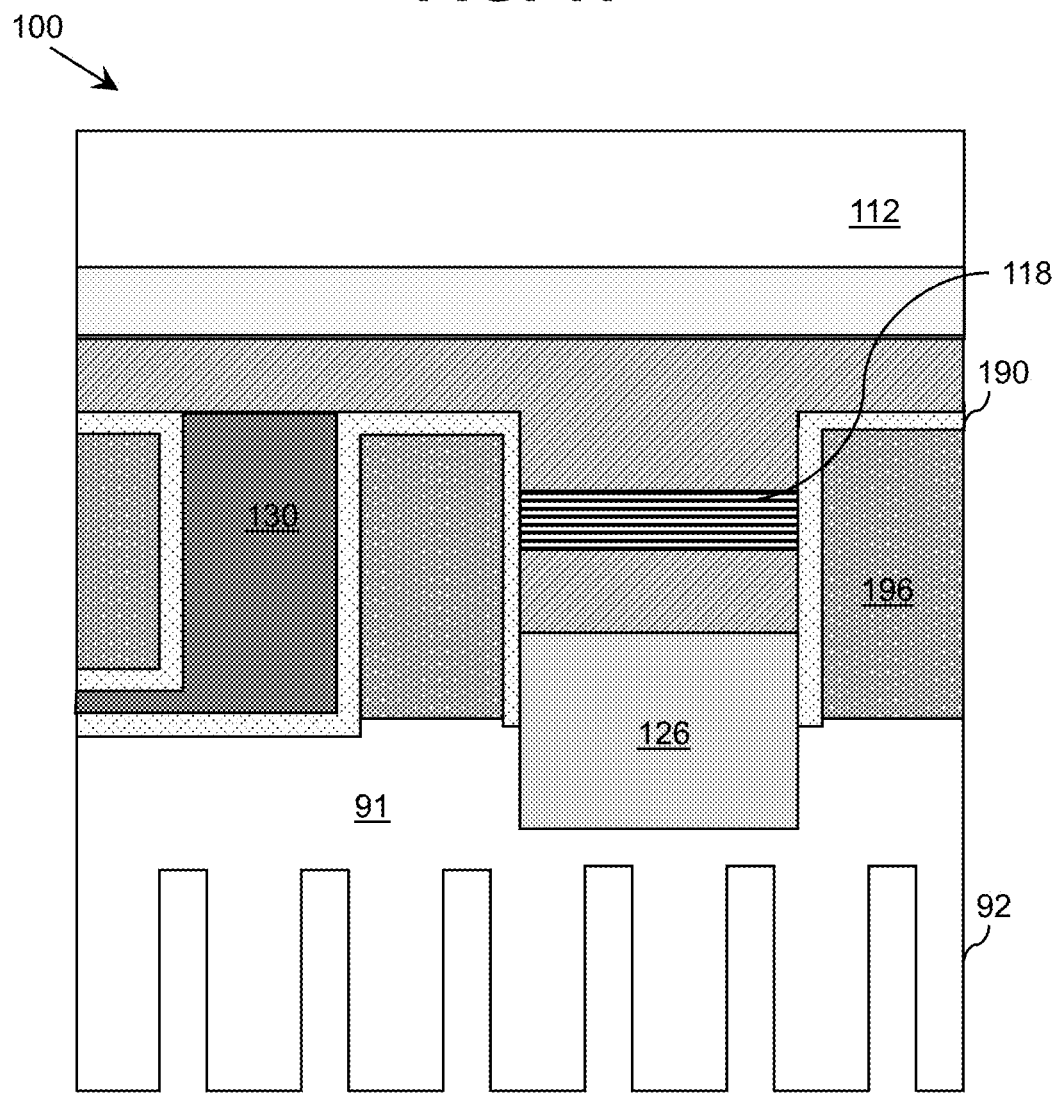
FIG. 11 shows a schematic structure of an optoelectronic device according to an embodiment.

In another embodiment, the thermally conductive filler material can be formed of any metal material that is electrically conductive. For example, in FIG. 11, a schematic structure of an illustrative optoelectronic device 100 according to an embodiment in shown. In this embodiment, the n-type electrode 130 and the p-type electrode 126 are electrically isolated by an insulator layer 190. The insulator layer 190 is formed of a material that UV transparent, UV reflective, or both. A thermally conductive filler material 196 is deposited adjacent to the insulator layer 190. The thermally conductive filler material 196 is formed of a material that is UV reflective.

In any of the embodiments provided, an additional temperature control module can infer a junction temperature of the optoelectronic device by measuring the temperature at at least one point in the heatsink and alter the operation of the optoelectronic device to maintain an acceptable heating level and/or thermal load. The temperature control module can include an algorithm for temporal adjustment of the intensity of each optoelectronic device to maintain acceptable thermal loads and/or heating levels for each device while maintaining the largest possible emission requirement for the array of optoelectronic devices. In an embodiment, the intensity of the operation of the optoelectronic devices can vary with time to maintain an acceptable thermal load. In a further embodiment, the time dependent intensity can vary, but still maintain a continuous emission of radiation. The temperature control module can be configured to provide recorded data of the thermal loads and intensity of each optoelectronic device as a function of time. A signaling module can also be provided to indicate the temperature of the optoelectronic device. The signaling module can comprise an optical visible mission source where the intensity of the emission correlates to the heating of the optoelectronic device.

Figure 12:
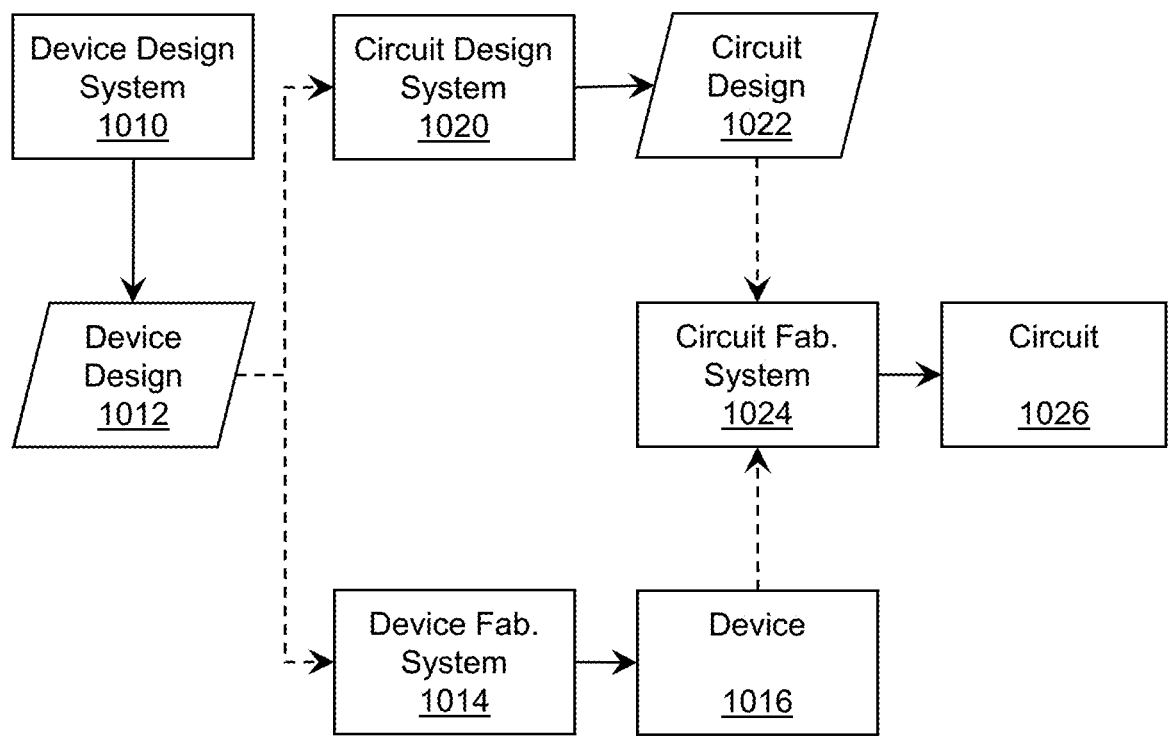
FIG. 12 shows an illustrative flow diagram for fabricating a circuit that comprises an optoelectronic module according to one the various embodiments described herein.

In one embodiment, the invention provides a method of designing and/or fabricating a circuit that includes one or more of the devices designed and fabricated as described herein. To this extent, FIG. 12 shows an illustrative flow diagram for fabricating a circuit 1026 according to an embodiment. Initially, a user can utilize a device design system 1010 to generate a device design 1012 for a semiconductor device as described herein. The device design 1012 can comprise program code, which can be used by a device fabrication system 1014 to generate a set of physical devices 1016 according to the features defined by the device design 1012. Similarly, the device design 1012 can be provided to a circuit design system 1020 (e.g., as an available component for use in circuits), which a user can utilize to generate a circuit design 1022 (e.g., by connecting one or more inputs and outputs to various devices included in a circuit). The circuit design 1022 can comprise program code that includes a device designed as described herein. In any event, the circuit design 1022 and/or one or more physical devices 1016 can be provided to a circuit fabrication system 1024, which can generate a physical circuit 1026 according to the circuit design 1022. The physical circuit 1026 can include one or more devices 1016 designed as described herein.

In another embodiment, the invention provides a device design system 1010 for designing and/or a device fabrication system 1014 for fabricating a semiconductor device 1016 as described herein. In this case, the system 1010, 1014 can comprise a general purpose computing device, which is programmed to implement a method of designing and/or fabricating the semiconductor device 1016 as described herein. Similarly, an embodiment of the invention provides a circuit design system 1020 for designing and/or a circuit fabrication system 1024 for fabricating a circuit 1026 that includes at least one device 1016 designed and/or fabricated as described herein. In this case, the system 1020, 1024 can comprise a general purpose computing device, which is programmed to implement a method of designing and/or fabricating the circuit 1026 including at least one semiconductor device 1016 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 1010 to generate the device design 1012 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 1010 for designing and/or a device fabrication system 1014 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:
1. A device comprising:
an optoelectronic device including a first electrode and a second electrode;
a mounting structure for the optoelectronic device, wherein the mounting structure includes:
a body formed of an insulating material; and
a heatsink element embedded within the body;
a first metal contact located between the insulating material of the body and the first electrode, wherein the first metal contact contacts the first electrode and the insulating material of the body of the mounting structure without contacting the heatsink element, and wherein the first metal contact enables connection between the first electrode and an electrode of another optoelectronic device located on a first side of the mounting structure;
a conductive heatsink comprising a metallic material, the conductive heatsink located adjacent to an opposite side of the mounting structure as the optoelectronic device, wherein the heatsink element connects the second electrode to the conductive heatsink and the first electrode is electrically isolated from the conductive heatsink;

a set of integrated circuit control elements located between the conductive heatsink and the mounting structure, wherein each of the set of integrated circuit control elements includes circuitry to enable the optoelectronic device to be selectively turned on and off; and a set of bumpers connecting the mounting structure to the conductive heatsink.

2. The device of claim 1, further comprising a second metal contact located between the heatsink element and the second electrode, wherein the second metal contact enables connection between the second electrode and at least one other contact on the first side of the mounting structure.

3. The device of claim 2, wherein the second metal contact directly contacts the second electrode and the heatsink element and the insulating material of the mounting structure.

4. The device of claim 1, wherein the set of integrated circuit control elements directly contact the set of bumpers.

5. The device of claim 1, wherein the optoelectronic device is one of a plurality of optoelectronic devices forming a thin film transistor (TFT) active matrix arrangement.

6. The device of claim 1, wherein the optoelectronic device is an ultraviolet light emitting diode.

7. The device of claim 4, further comprising a connection between at least one integrated circuit control element of the set of integrated circuit control elements and the conductive heatsink via the set of bumpers, wherein the connection provides a ground connection for the at least one integrated circuit control element.

8. The device of claim 2, wherein the first electrode, the second electrode, and the embedded heatsink element include a magnetic component to facilitate automatic alignment of the optoelectronic device and the mounting structure with the first and the second metal contacts.

9. The device of claim 1, wherein the body of the mounting structure is formed of a single insulating material and a thickness of the body is approximately equal to a thickness of the heatsink element.

10. A device comprising:
an optoelectronic device including a first electrode and a second electrode;
a mounting structure for the optoelectronic device, wherein the mounting structure includes:
a body formed of an insulating material; and
a heatsink element embedded within the body;
a first metal contact located between the insulating material of the body and the first electrode without contacting the heatsink element, wherein the first metal contact contacts the first electrode and the insulating material of the body of the mounting structure without contacting the heatsink element;
a second metal contact located between the heatsink element and the second electrode, wherein the first and second metal contacts enable connections to other electrodes of other optoelectronic devices located on a first side of the mounting structure;
a conductive heatsink comprising a metallic material, the conductive heatsink located adjacent to an opposite side of the mounting structure as the optoelectronic device, wherein the heatsink element connects the second metal contact to the conductive heatsink and the first electrode is electrically isolated from the conductive heatsink;

a set of integrated circuit control elements located between the conductive heatsink and the mounting structure, wherein each of the set of integrated circuit control elements includes circuitry to enable the optoelectronic device to be selectively turned on and off; and a set of bumpers connecting the mounting structure to the conductive heatsink.

11. The device of claim 10, wherein the second metal contact directly contacts the second electrode and the heatsink element and the insulating material of the mounting structure.

12. The device of claim 10, wherein the set of integrated circuit control elements directly contact the set of bumpers.

13. The device of claim 10, wherein the optoelectronic device is one of a plurality of optoelectronic devices forming a thin film transistor (TFT) active matrix arrangement.

14. The device of claim 10, wherein the optoelectronic device is an ultraviolet light emitting diode.

15. The device of claim 12, further comprising a connection between at least one integrated circuit control element of the set of integrated circuit control elements and the conductive heatsink via the set of bumpers, wherein the connection provides a ground connection for the at least one integrated circuit control element.

16. The device of claim 10, wherein the first electrode, the second electrode, and the embedded heatsink element include a magnetic component to facilitate automatic alignment of the optoelectronic device and the mounting structure with the first and the second metal contacts.

17. The device of claim 10, wherein the body of the mounting structure is formed of a single insulating material and a thickness of the body is approximately equal to a thickness of the heatsink element.

18. A device comprising:
an optoelectronic device including an n-type electrode and a p-type electrode;
a mounting structure for the optoelectronic device, wherein the mounting structure includes:
a body formed of an insulating material; and
a heatsink element embedded within the body;
a first metal contact located between the insulating material of the body and the n-type electrode without contacting the heatsink element, wherein the first metal contact contacts the n-type electrode and the insulating material of the body of the mounting structure without contacting the heatsink element;
a second metal contact located between the heatsink element and the p-type electrode, wherein the first and second metal contacts enable connections to other electrodes of other optoelectronic devices located on a first side of the mounting structure;
a conductive heatsink comprising a metallic material, the conductive heatsink located adjacent to an opposite side of the mounting structure as the optoelectronic device, wherein the heatsink element connects the second metal contact to the conductive heatsink and the n-type electrode is electrically isolated from the conductive heatsink;
a set of integrated circuit control elements located between the conductive heatsink and the mounting structure, wherein each of the set of integrated circuit control elements includes circuitry to enable the optoelectronic device to be selectively turned on and off; and
a set of bumpers connecting the mounting structure to the conductive heatsink.

19. The device of claim 18, wherein the set of bumpers are configured to provide a connection between at least one integrated circuit control element of the set of integrated circuit control elements and the conductive heatsink, wherein the connection provides a ground connection for the at least one integrated circuit control element.

20. The device of claim 18, wherein the n-type electrode, the p-type electrode, and the embedded heatsink element include a magnetic component to facilitate automatic alignment of the optoelectronic device and the mounting structure with the first and the second metal contacts.

* * * * *